(12) United States Patent
Zhang et al.

(10) Patent No.: US 8,156,357 B2
(45) Date of Patent: Apr. 10, 2012

(54) VOLTAGE-BASED MEMORY SIZE SCALING IN A DATA PROCESSING SYSTEM

(75) Inventors: Shayan Zhang, Austin, TX (US); James D. Burnett, Austin, TX (US); Prashant U. Kenkare, Austin, TX (US); Hema Ramamurthy, Austin, TX (US); Andrew C. Russell, Austin, TX (US); Michael D. Snyder, Cedar Park, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 532 days.

(21) Appl. No.: 12/360,656

(22) Filed: Jan. 27, 2009

(65) Prior Publication Data

US 2010/0191990 A1 Jul. 29, 2010

(51) Int. Cl.
*G06F 1/32* (2006.01)
(52) U.S. Cl. ........................................ 713/320; 713/321
(58) Field of Classification Search .......... 713/300–340; 711/140, 128–129
See application file for complete search history.

(56) References Cited

U.S. PATENT DOCUMENTS

| | | | | |
|---|---|---|---|---|
| 6,539,487 | B1* | 3/2003 | Fields et al. | 713/340 |
| 6,901,521 | B2* | 5/2005 | Chauvel et al. | 713/300 |
| 7,197,670 | B2 | 3/2007 | Boatright et al. | |
| 7,647,514 | B2* | 1/2010 | Ishihara et al. | 713/320 |
| 7,904,658 | B2* | 3/2011 | Abadeer et al. | 711/128 |
| 2002/0103977 | A1* | 8/2002 | Ewoldt | 711/140 |
| 2007/0280026 | A1 | 12/2007 | Hunter et al. | |
| 2008/0209243 | A1* | 8/2008 | Ghiasi et al. | 713/320 |
| 2008/0307240 | A1* | 12/2008 | Dahan et al. | 713/320 |

OTHER PUBLICATIONS

Chang, Jonathan et al.; "The 65-nm 16-MB Shared On-Die L3 Cache for the Dual-Core Intel Xeon Processor 7100 Series"; IEEE Journal of Solid-State Circuits; Apr. 2007; pp. 846-852; vol. 42, No. 4, IEEE.
Gerosa, Gianfranco et al.; "A Sub-1W to 2W Low-Power IA Processor for Mobile Internet Devices and Ultra-Mobile PCs in 45nm Hi-K etal Gate CMOS"; ISSCC 2008, Session 13; 2008; pp. 256-611; USA.

* cited by examiner

*Primary Examiner* — Raymond Phan
(74) *Attorney, Agent, or Firm* — Joanna G. Chiu; James L. Clingan, Jr.

(57) ABSTRACT

A memory has bits that fail as power supply voltage is reduced to reduce power and/or increase endurance. The bits become properly functional when the power supply voltage is increased back to its original value. With the reduced voltage, portions of the memory that include non-functional bits are not used. Much of the memory may remain functional and use is retained. When the voltage is increased, the portions of the memory that were not used because of being non-functional due to the reduced power supply voltage may then be used again. This is particularly useful in a cache where the decrease in available memory due to power supply voltage reduction can be implemented as a reduction in the number of ways. Thus, for example an eight way cache can simply be reduced to a four way cache when the power is being reduced or endurance increased.

20 Claims, 4 Drawing Sheets

| WAY_X | VALID | LOCK |
|---|---|---|
| LINE 0 | 0 | 1 |
| LINE 1 | 1 | 0 |
| LINE 2 | 0 | 1 |
| ... | 1 | 0 |
| LINE N−1 | 0 | 1 |

Vmem = V2 ⟵ 94

| WAY_X | VALID | LOCK |
|---|---|---|
| LINE 0 | 0 | 1 |
| LINE 1 | 1 | 0 |
| LINE 2 | 1 | 0 |
| ... | 1 | 0 |
| LINE N−1 | 1 | 0 |

Vmem = V3 ⟵ 92

| WAY_X | VALID | LOCK |
|---|---|---|
| LINE 0 | 1 | 0 |
| LINE 1 | 1 | 0 |
| LINE 2 | 1 | 0 |
| ... | 1 | 0 |
| LINE N−1 | 1 | 0 |

Vmem = V4 ⟵ 90

*FIG. 4*

VOLTAGE-BASED MEMORY SIZE SCALING IN A DATA PROCESSING SYSTEM

BACKGROUND

1. Field

This disclosure relates generally to data processing systems, and more specifically, to voltage-based memory size scaling in a data processing system.

2. Related Art

Typically, within a memory, the minimum supply voltage (Vmin) is set to the lowest voltage (with a predetermined margin) at which no bits fail. However, within a same die, different memories or portions of memory may vary in performance due to process and temperature variations. Typically, the number of voltage sensitive failing bits at a voltage lower than Vmin is only a very small fraction of total memory bits on die. However, a fixed Vmin level with a guard band to prevent the voltage sensitive bits from failing has to be selected which is higher than a supply voltage level at which most memories can operate. This may lead to loss of functionality and/or efficiency of a data processing system in its memory usage since it limits those memories which may be capable of operating at lower supply voltages.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, when a fixed Vmin level is selected which is higher than a supply voltage level at which most memories can operate, loss of functionality and/or efficiency of a data processing system in its memory usage may occur when operating at supply voltages lower than the fixed Vmin value. In one embodiment, the supply voltage (Vmem) for a memory is changed to different Vmin levels, where as the Vmin levels decreases, increasingly larger sections of the memory become non-functional (i.e. refrain from functional access) and stay in a data retention mode. A non-functional section of memory indicates a section of memory that may no longer be reliably accessed. A read or write access to the non-functional section of memory would corrupt the data. However, the non-functional section of memory may reliably retain the data. Upon raising the supply voltage for the memory, sections which had previously become non-functional may become functional again. Therefore, at lower voltage levels for Vmem, the size of the memory may be scaled down such that the memory can still operate, but with a smaller number of functional bits.

For example, in one embodiment, a cache is supplied by Vmem where different voltage levels for Vmem allows for a different number of ways to be enabled. For example, as the voltage level for Vmem decreases, a lower number of cache ways are functional and thus enabled. That is, as Vmem decreases, an increasing number of cache ways become non-functional and thus may no longer be reliably accessed. For example an eight way cache can be reduced to a four way cache when the supply voltage is being reduced or the die temperature is increased or reliability endurance increased. Therefore, in one embodiment, a multiple way cache is provided whose ways can be disabled and re-enabled based on changes in its operating voltage, Vmem. In another embodiment, a multiple way cache is provided whose ways can be disabled and re-enabled based on changes in its operating temperature.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, a plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
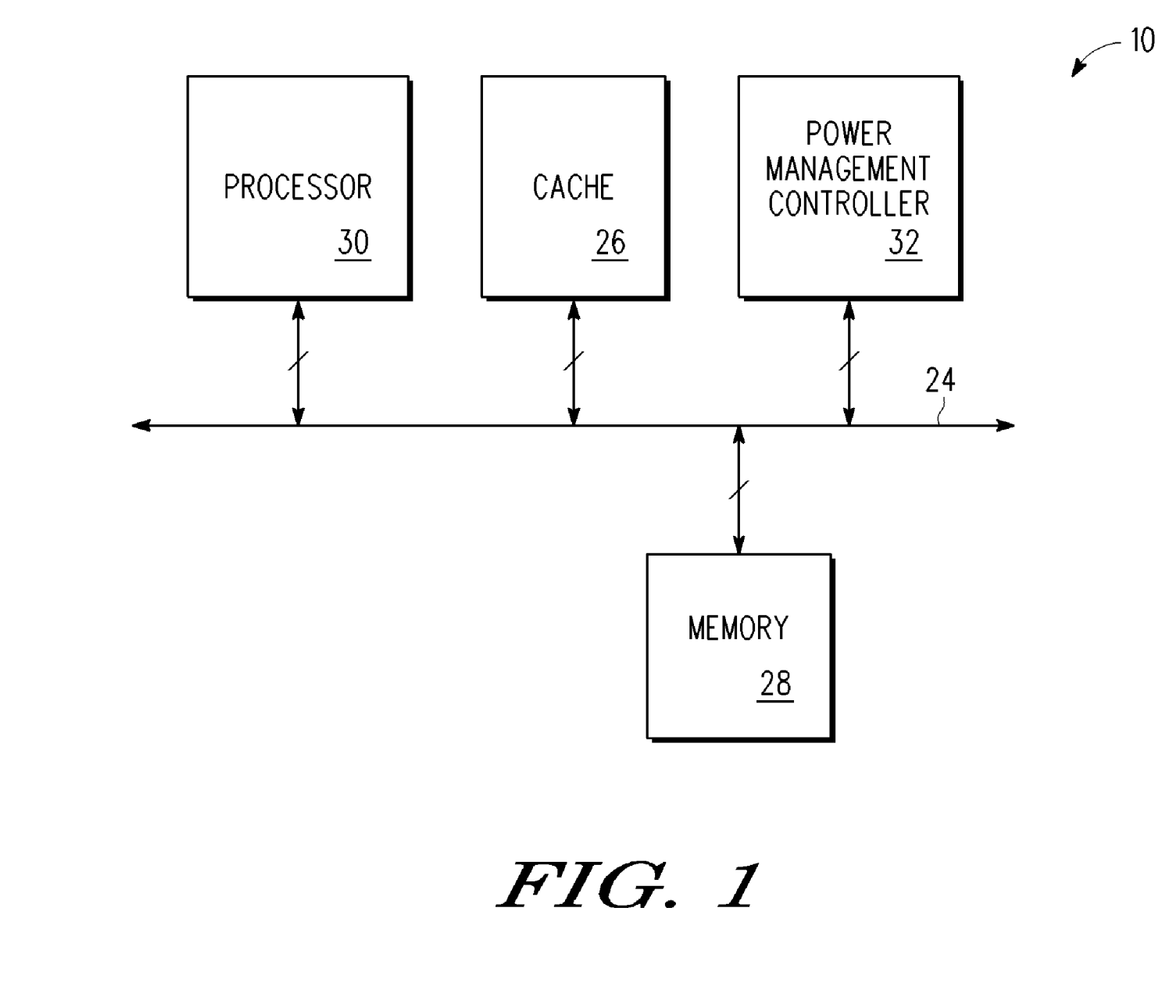
FIG. 1 illustrates in block diagram form a data processing system in accordance with one embodiment of the present invention.

FIG. 1 illustrates, in block diagram form, a data processing system 10 in accordance with one embodiment of the present invention. Data processing system 10 includes a processor 30, a cache 26, a system bus 24, a memory 28 and a power management controller 32. Each of processor 30, cache 26, power management controller 32, and memory 28 are coupled to system bus 24 via respective bidirectional conductors. Processor 30 implements data processing operations. Note that memory 28 can be any type of memory. In one embodiment, all of data processing system 10 is on a single integrated circuit. Alternatively, data processing system 10 can be implemented using more than one integrated circuit. In one embodiment, at least all of processor 30 is on a single integrated circuit.

In operation, processor 30 functions to implement a variety of data processing functions by executing a plurality of data processing instructions. Cache 26 temporarily stores data that is frequently needed by processor 30. Cache 26 is a set-associative multi-way cache which, in one embodiment, is capable of storing multiple types of information, such as instruction information and data information (e.g. operand information). Information needed by processor 30 that is not within cache 26 is stored in memory 28. Power management controller 32 operates to control the power supplies of data processing system 10. Note that operation of processor 30 and power management controller 32 are understood in the art and will not be described in more detail herein except to further describe operation of cache 26.

Figure 2:
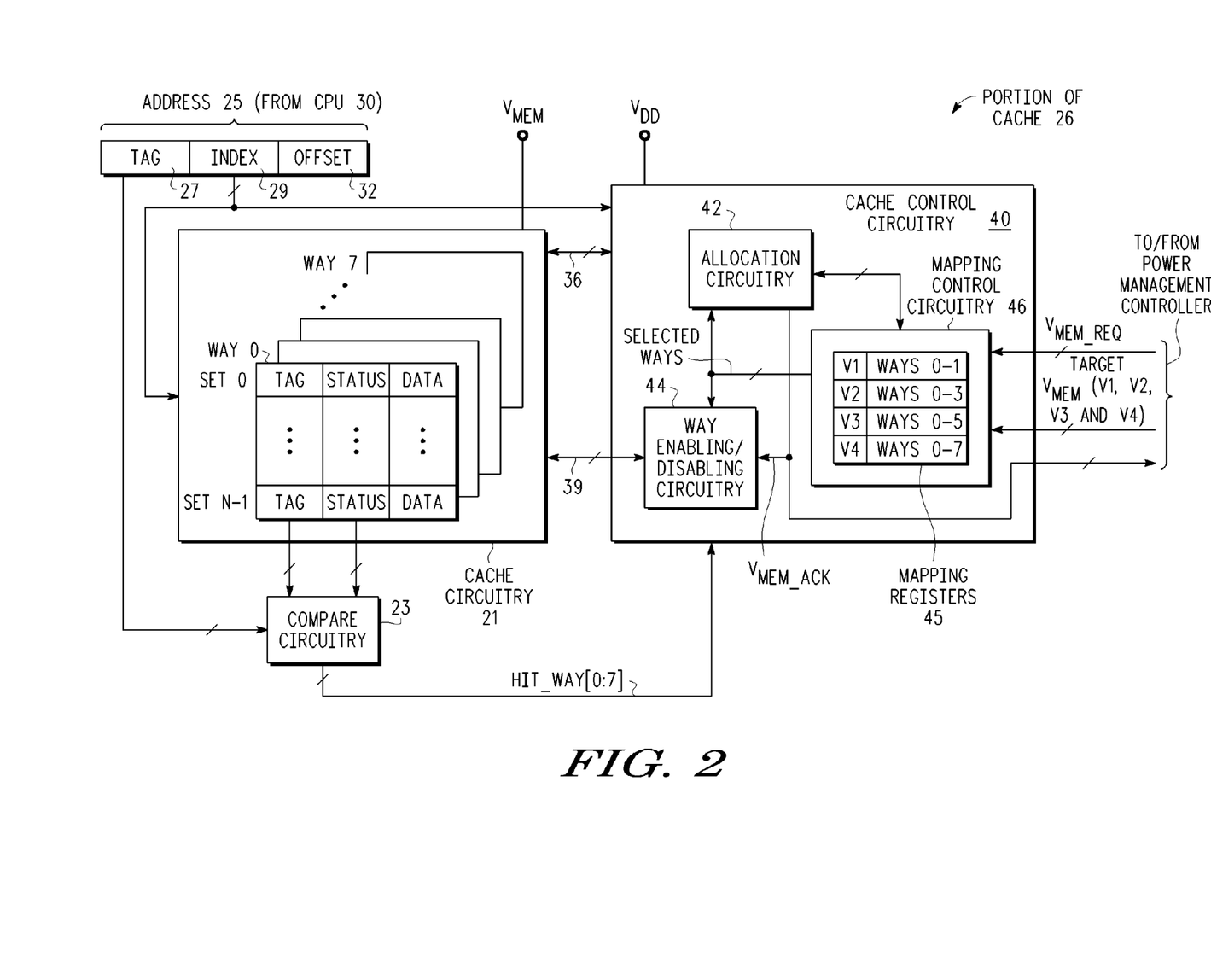
FIG. 2 illustrates in block diagram form a portion of a cache within the data processing system of FIG. 1 in accordance with one embodiment of the present invention.

FIG. 2 illustrates a portion of cache 26 of FIG. 1 in accordance with one embodiment. Alternate embodiments of cache 26 may use a different structure than that illustrated in FIG. 2. Cache 26 may be any type of cache, such as a data cache, an instruction cache, or a unified cache. The portion of cache 26 illustrated in FIG. 2 has "N" sets and 8 ways, and may be referred to as a multi-way cache or as a multi-way set-associative cache. Therefore, cache 26 can be described as having N sets, each set having 8 ways. Cache 26, in alternate embodiments, may have any number of sets and any number of ways. Note that, as used herein, a cache line or a cache entry refers to an intersection of a cache way and a set. For example, way 0 includes N cache lines (line 0 to line N-1), each corresponding to one of set 0 to set N-1. Therefore, when a way is selected for replacement, the information in one or more cache lines (which is selected by index portion 29, as will be described below) is actually replaced. That is, the entire way may not be replaced, but only one or more particular lines or entries.

In the illustrated embodiment, cache circuitry 21 is storage circuitry which stores information in each of a plurality of cache lines. For example, cache circuitry 21 includes tag, status, and data fields for the cache lines. Address 25 is provided from processor 30, which corresponds to an access address for a memory, such as memory 28. Address 25 includes a tag portion 27, an index portion 29, and an offset portion 32. Index portion 29 is provided to cache circuitry 21 which indicates a particular cache line (i.e. one of set 0 to set N-1). Compare circuitry 23 is coupled to receive tag portion 27 and is coupled to cache circuitry 21 to receive tag and status information. Based on this received information, compare circuitry 23 determines whether there has been a cache hit or a cache miss. In the illustrated embodiment, a plurality of hit/miss signals labeled HIT_WAY[0:7] are provided to cache control circuitry 40. Each HIT_WAY[0:7] signal indicates whether or not there has been a cache hit for its corresponding way in cache circuitry 21. Alternate embodiments may use a cache miss signal in addition to or instead of a cache hit signal.

Cache control circuitry 40 is coupled to cache circuitry 21 by way of conductors or signals 36 and 39. Index portion 29 is also provided to the cache control circuitry 40 for indicating a particular cache line (i.e. one of set 0 to set N-1) Also, cache circuitry 21 is powered by supply voltage Vmem and cache control circuitry 40 is powered by supply voltage Vdd. In one embodiment, Vmem and Vdd are different supply voltages which may be set to different values, independent of each other. Alternatively, Vmem and Vdd may be powered by the same supply voltage.

Cache control circuitry 40 includes allocation circuitry 42, mapping control circuitry 46, and way enabling/disabling circuitry 44. Mapping control circuitry 46 is coupled to allocation circuitry 42 and way enabling/disabling circuitry 44. Allocation circuitry 42 is coupled to way enabling/disabling circuitry 44. Mapping control circuitry 46 is coupled to receive Vmem_req and target Vmem from power management controller 32 and allocation circuitry 42 is coupled to provide Vmem_ack to way enabling/disabling circuitry 44 and power management controller 32. Also, mapping control circuitry 46 provides selected ways to allocation circuitry 42 and way enabling/disabling circuitry 44, and includes mapping registers 45. Mapping registers 45 store possible voltage values which may be used for Vmem and the ways which may be used at each voltage value.

In the illustrated embodiment, mapping registers 45 includes four voltage values, V1-V4, where V1 is less than V2, V2 is less than V3, and V3 is less than V4. Also, mapping registers 45 includes which ways can be enabled at the corresponding voltage value for Vmem. For example, when Vmem is set to the value V1, ways 0-1 of cache circuitry 21 may be enabled. When Vmem is set to the value V2, ways 0-3 may be enabled. When Vmem is set to the value V3, ways 0-5 may be enabled. When Vmem is set to the value V4, ways 0-7 may be enabled. Therefore, in this embodiment, at the lowest voltage (V1), only 2 ways are functional and thus can be enabled because the low voltage value may make the other ways become non-functional and thus unable to reliably access the stored data. However, at the next lowest voltage (V2), 4 of the ways may be functional and thus can be enabled. Therefore, in one embodiment, each of V1-V4 corresponds to a minimum voltage (Vmin) of the memory at which the corresponding enabled ways are considered functional and thus can reliably access the stored data. Thus, mapping registers 45 may provide information that correlates non-functional portions (e.g. ways) of a memory with values of the supply voltage (e.g. Vmem). Note that mapping registers 45 may include one or more registers to store this information. Also, note that any number of voltage values may be stored, and each voltage value may correspond to any number of ways.

In one embodiment, which ways are functional at which voltage level is determined by pre-characterizing the particular die and storing this information in mapping registers 45 prior to operating data processing system 10. For example, in one embodiment, memory built-in self-test (BIST) may be used to pre-characterize the cache's functional ways versus voltage. In an alternate embodiment, the voltage levels may be predetermined and which ways are functional at each of the predetermined voltage levels may be determined during operation of data processing system 10. In this case, which ways are functional at each of the voltage levels may be dynamically changed during operation of data processing system 10. In yet another embodiment, the different voltage levels and the corresponding functional ways can be determined dynamically, during operation of data processing system 10, depending on a change in operating condition, such as changes in die temperature and thermal profile surrounding the cache way array blocks.

In the cases in which the functional ways and/or voltage levels are determined dynamically, cache control circuitry 40 may include additional circuitry to make these determinations. For example, in one embodiment, cache circuitry 21 may include testing columns and rows which may be used to determine the functional ways. In another embodiment, error correcting code (ECC) may be used to determine the functional cache entries.

Although one type of architecture for cache 26 has been illustrated in FIG. 2, alternate embodiments of cache 26 may use any desired or appropriate architecture. The architecture illustrated in FIG. 2 is merely intended to be one possible representative architecture. Any cache architecture that allows for the desired cache replacement may be used.

In operation, index portion 29 is used to select a set in cache circuitry 21. Tag and status information for this set are then provided to compare circuitry 23. The tag information from cache circuitry 21 is compared to tag 27 and qualified by status information (e.g. valid bits) from cache circuitry 21. The result of the compare and qualification (e.g. match and valid) determines whether or not a cache hit occurs. As described above, each HIT_WAY[0:7] signal indicates whether or not there has been a cache hit for its corresponding way in cache circuitry 21.

In the case of a read access to cache 26, upon a cache hit, the cache data of the cache line which resulted in the cache hit are provided, via conductors 39, to cache control circuitry 40 which can then provide the cache data to bus 24. In the case of a write access to cache 26, upon a cache hit, information (e.g. the cache data for storage into cache circuitry 21) can be received from bus 24 by cache control circuitry 40. The cache data can be provided by cache control circuitry 40 for storage into the appropriate cache line of cache circuitry 21 via conductors 39. Also, cache control circuitry 40 can appropriately update the status field of the cache line. (Note that the specific circuitry used to route the cache data from cache circuitry 21 to bus 24 and the specific circuitry used to receive the cache data from bus 24 and route it to the line within cache circuitry 21 which caused the hit and to update the status information are not illustrated, since they are well understood in the art.)

In the case of a cache miss, allocation circuitry 42, using the selected ways provided by mapping control circuitry 46, identifies a cache line for replacement and updates the cache line. Any known cache allocation policy can be used to select a cache line for replacement, such as, for example, a round robin method, a pseudo-least recently used (PLRU) method, etc. However, as will be described further below, the cache allocation policy can only select a cache way for replacement among the enabled (i.e. functional or accessible) cache ways as determined by mapping control circuitry 46. Upon a cache miss, the new cache data for storage into the newly allocated cache line is provided to cache control circuitry 40 by bus 24. The new cache data can then be provided for storage into the newly allocated cache line of cache circuitry 21 via conductors 39. Also, cache control circuitry 40 can appropriately generate the status information for storage into the status field of the newly allocated cache line. (Note that the specific circuitry used to receive the cache data and route it to the newly allocated cache line within cache circuitry 21 and to generate the status information for the newly allocated cache line is not illustrated, since it is well understood in the art.)

In the illustrated embodiment, cache control circuitry 40 may also provide control signals 36 to cache circuitry 21 (e.g. for read/write control). For example, cache control circuitry 40 may, under control of processor 30, update cache circuitry 21. For example, processor 30 may execute special cache instructions to update status information. Also, in one embodiment, cache control circuitry 40, under control of processor 30, such as via special cache instructions, may update mapping registers 45, such as in the case where the information can be dynamically changed (e.g. updating the V1-V4 definition and/or adjusting way allocation within each of V1-V4 levels based on dynamic changes in die temperature or thermal profile surrounding the cache way array blocks). In such an embodiment, an additional signal to dynamically update V1-V4 may be provided by processor 30 to mapping control circuitry 46. For example, mapping registers 45 may be configured by a temperature range, e.g. T1-T4 (where T1 is less than T2, T2 is less than T3, and T3 is less than T4), with ways qualified in each of the temperature levels, or T1-T4 and V1-V4 may be combined in any manner (e.g. T1/V4, T2/V3, T3/V2, and T4/V1) to provide a voltage and temperature controllability in a temperature-aware dynamic cache size scaling. Although FIG. 2 illustrates specific circuitry that may be used to implement a portion of cache 26 of FIG. 1, alternate embodiments may use any desired circuitry. A wide variety of circuit implementations may be used. The circuitry illustrated in FIG. 2 is merely intended to illustrate one possible embodiment.

During operation of cache 26, power management controller 32 may determine that Vmem needs to be increased or decreased to a new target Vmem value. (Note that operation of power management controller 32 is well understood in the art and will not be described further herein.) Therefore, during operation of cache 26, a Vmem_req may be received by cache 26 which requests the increasing or decreasing of the current value of Vmem. Along with Vmem_req, a new target Vmem (one of V1, V2, V3, or V4 in the illustrated embodiment) is received. Therefore, based on the received target Vmem, mapping control circuitry 46 (which is aware of the current value of Vmem) can determine whether Vmem_req corresponds to a Vmem decrease request or a Vmem increase request. Upon a Vmem decrease request, some ways may need to be disabled because at the new target Vmem provided with the Vmem decrease request, these ways may become non-functional. Upon a Vmem increase request, some ways which were previously disabled may again become functional due to the new target Vmem and can thus be re-enabled. In an alternate embodiment, separate Vmem_req_increase and Vmem_req_decrease signals can be provided by power management controller 32.

Figure 3:
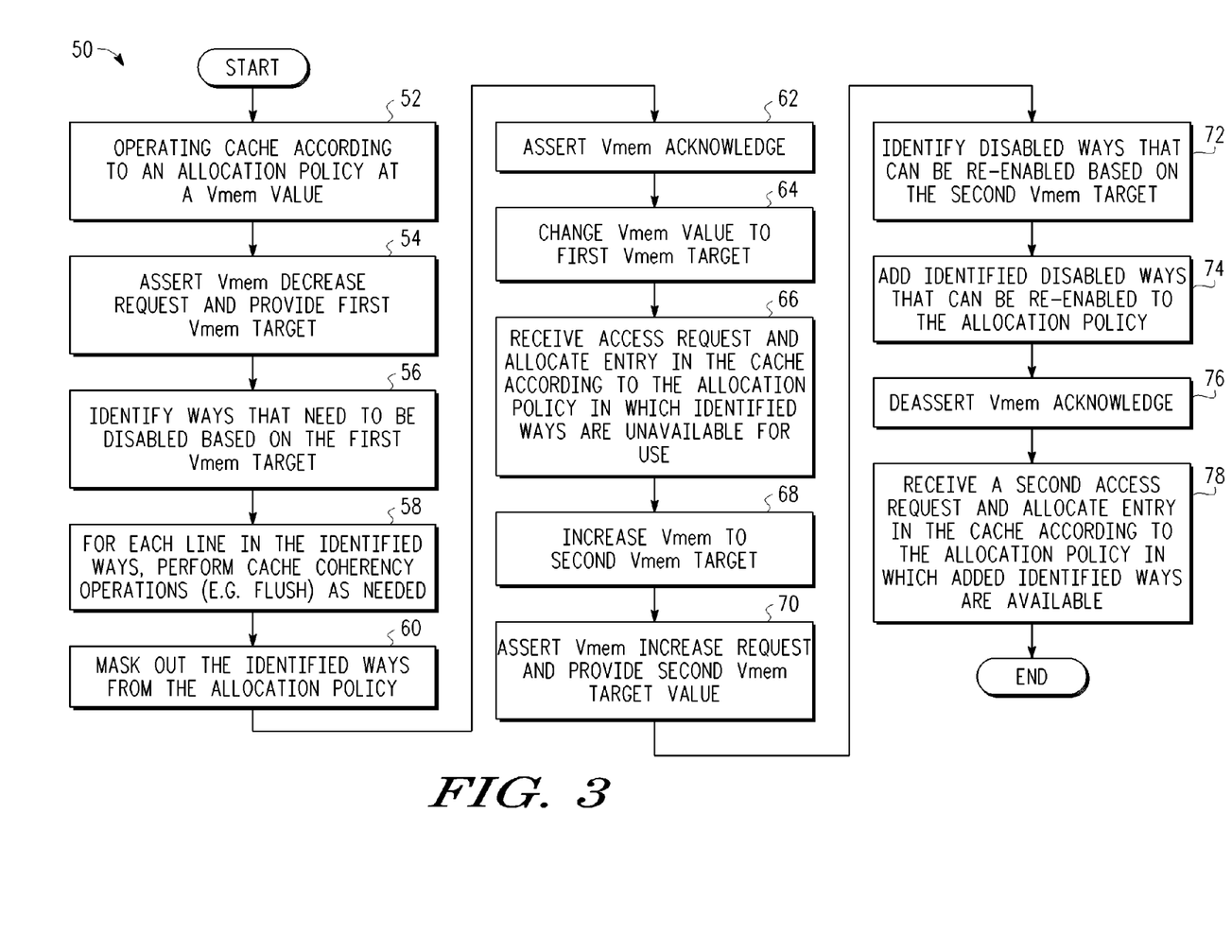
FIG. 3 illustrates, in flow diagram form, a method of operating the cache of FIG. 2 in accordance with one embodiment of the present invention.

FIG. 3 illustrates, in flow diagram form, a method of operating cache 26 in accordance with one embodiment of the present invention. Flow 50 begins at the start oval and proceeds to block 52 in which cache 26 is operated according to an allocation policy at a particular Vmem value. Flow then proceeds to block 54 where a Vmem decrease request is asserted (which may refer to the assertion of Vmem_req) and a first Vmem target is provided by power management controller 32 to cache 26. Therefore, a change in Vmem has been requested to a new Vmem value, indicated by the first Vmem target. Flow then proceeds to block 56 where the ways that need to be disabled, based on the first Vmem target, are identified. For example, mapping control circuitry 46 receives the first Vmem target (via the target Vmem signal) and determines which ways need to be disabled using mapping registers 45. For example, if the current Vmem is at V2 and the first Vmem target is now V1, ways 2 and 3 now need to be disabled since they will become non-functional upon changing Vmem from V2 to V1. The selected ways according to mapping registers 45 (e.g. ways 0-1 in the case of changing to V1) are provided to both allocation circuitry 42 and way enabling/disabling circuitry 44.

Flow then proceeds to block 58 where, for each cache line in the identified ways that need to be disabled, cache coherency operations are performed, as needed, such as a flush operation or an invalidate operation. For example, the selected ways are provided to way enabling/disabling circuitry 44. From this information, way enabling/disabling circuitry 44 can determine which ways are to be disabled (because it is aware of which ways are currently enabled). Therefore, way enabling/disabling circuitry 44 can perform a cache coherency operation on each cache line in the ways that are to be disabled, as needed. For example, if a cache line in a way to be disabled has modified data, it can be flushed such that modified data can be written to memory 28 such that memory 28 maintains coherency and this modified data is not lost. The cache line is also marked as invalid. If the cache line has clean data, then it can simply be invalidated without having to write any data to memory 28. Alternatively, other cache coherency operations can be performed by way enabling/disabling circuitry 44, as needed.

Referring back to flow 50, flow proceeds from block 58 to block 60 where the identified ways to be disabled are masked out from the allocation policy. For example, the selected ways are provided to allocation circuitry 42. From this information, allocation circuitry 42 can determine which ways are to be masked out from the allocation policy. That is, only the selected ways can be selected by allocation circuitry 42 for replacement when a cache allocation is needed. The other ways are masked out and thus cannot be selected anymore by the allocation policy used by allocation circuitry 42. In this manner, cache 26 can now be accessed exclusive of those masked out ways.

Flow then proceeds to block 62 where Vmem_ack is asserted. For example, allocation circuitry 42 can assert Vmem_ack once the allocation policy has been appropriately updated. Flow then proceeds from block 62 to block 64 where the value of Vmem can be changed to the first Vmem target. Therefore, the asserted Vmem_ack can be used by power management controller 32 to know when to change the value of Vmem to the first Vmem target. That is, in one embodiment, power management controller 32 should not decrease the value of Vmem until selected ways of the cache have been properly disabled, the allocation policy has been properly updated, and the Vmem_ack signal is asserted.

Flow then proceeds to block 66 where an access request is received which requires allocation into cache circuitry 21. For example, in one embodiment, the received access request may have resulted in a miss in cache circuitry 21, thus requiring allocation into cache circuitry 21. In this case, allocation circuitry 42 may allocate an entry in cache circuitry 21 according to the allocation policy in which the identified ways are unavailable for use (i.e. in which the identified ways are masked out, as described above in reference to block 60).

After block 66, flow proceeds to block 68, where, at some time later, power management controller 32 may determine that an increase of Vmem to a second Vmem target is needed and thus may increase Vmem to the second Vmem target. Since this is an increase in Vmem, it can be done immediately, prior to updating the allocation policy (as will be described in reference to block 72 below). However, in an alternate embodiment the actual change to increase Vmem to the second Vmem target may occur later, such as after the allocation policy is updated (i.e. after block 74) or after Vmem_ack is deasserted (i.e. after block 76).

Referring back to flow 50, flow then proceeds from block 68 to block 70 where a Vmem increase request is asserted (which may refer to the assertion of Vmem_req) and a second Vmem target is provided by power management controller 32 to cache 26. Therefore, a change in Vmem has been requested to a new Vmem value, indicated by the second Vmem target. Flow then proceeds to block 72 where the disabled ways that need to be re-enabled, based on the second Vmem target, are identified. For example, mapping control circuitry 46 receives the second Vmem target (via the target Vmem signal) and determines which disabled ways need to be re-enabled using mapping registers 45. For example, if the current Vmem is now at V1 (according the example used above in reference to blocks 54 and 56), and the second Vmem target is now V2, previously disabled ways 2 and 3 now need to be re-enabled since they will again become functional upon changing Vmem from V1 back to V2. The selected ways according to mapping registers 45 (e.g. ways 0-3 in the case of changing to V2) are provided to both allocation circuitry 42 and way enabling/disabling circuitry 44.

Flow then proceeds to block 74 where the identified disabled ways to be re-enabled are added back to the allocation policy. For example, the selected ways are provided to allocation circuitry 42. From this information, allocation circuitry 42 can determine which previously disabled ways (which were previously masked out from the allocation policy) should be re-enabled and added back to the allocation policy. In this manner, these re-enabled ways can again be selected by allocation circuitry 42 for replacement when a cache allocation is needed.

Flow then proceeds to block 76 where Vmem_ack is deasserted. For example, Vmem_ack can be deasserted by allocation circuitry 42 once the allocation policy has been appropriately updated. In one embodiment, as described above, power management controller 32 may not actually change Vmem to the second Vmem target until Vmem_ack is deasserted.

Flow then proceeds to block 78 where a second access request is received which requires allocation into cache circuitry 21. For example, in one embodiment, the second received access request may also have resulted in a miss in cache circuitry 21, thus requiring allocation into cache circuitry 21. In this case, allocation circuitry 42 may allocate an entry in cache circuitry 21 according to the allocation policy in which the added identified ways are available for use (i.e. in which the previously disabled ways are re-enabled, as described above in reference to block 72). Flow 50 is then completed at the end oval and it can be restarted at block 52 at any time.

Although FIG. 3 illustrates a specific method that may be used to operate a portion of cache 26 of FIG. 2, alternate embodiments may use any desired operating method. A wide variety of operating steps and/or sequences in flow 50 may be used. The method illustrated in FIG. 3 is merely intended to illustrate one possible embodiment. For example, if a cache coherency operation is not required (because the identified ways to be disabled do not include modified data), a variation of flow 50 can be carried out. In this example, after a Vmem decrease request is asserted (block 54), a first Vmem target is provided (block 54), and ways to be disabled are identified (block 56), power management controller 32 can immediately decrease the value of Vmem and assert the Vmem_ack signal (so that a cache access request will not be accepted). Operations described in blocks 58 and 60 (such as masking out the identified ways from allocation policy) can be performed after the value of Vmem is decreased (e.g. from V2 down to V1). Upon completion of these operations, the Vmem_ack signal can be deasserted and a cache access request can be accepted (at which point flow can proceed to block 66).

Figure 4:
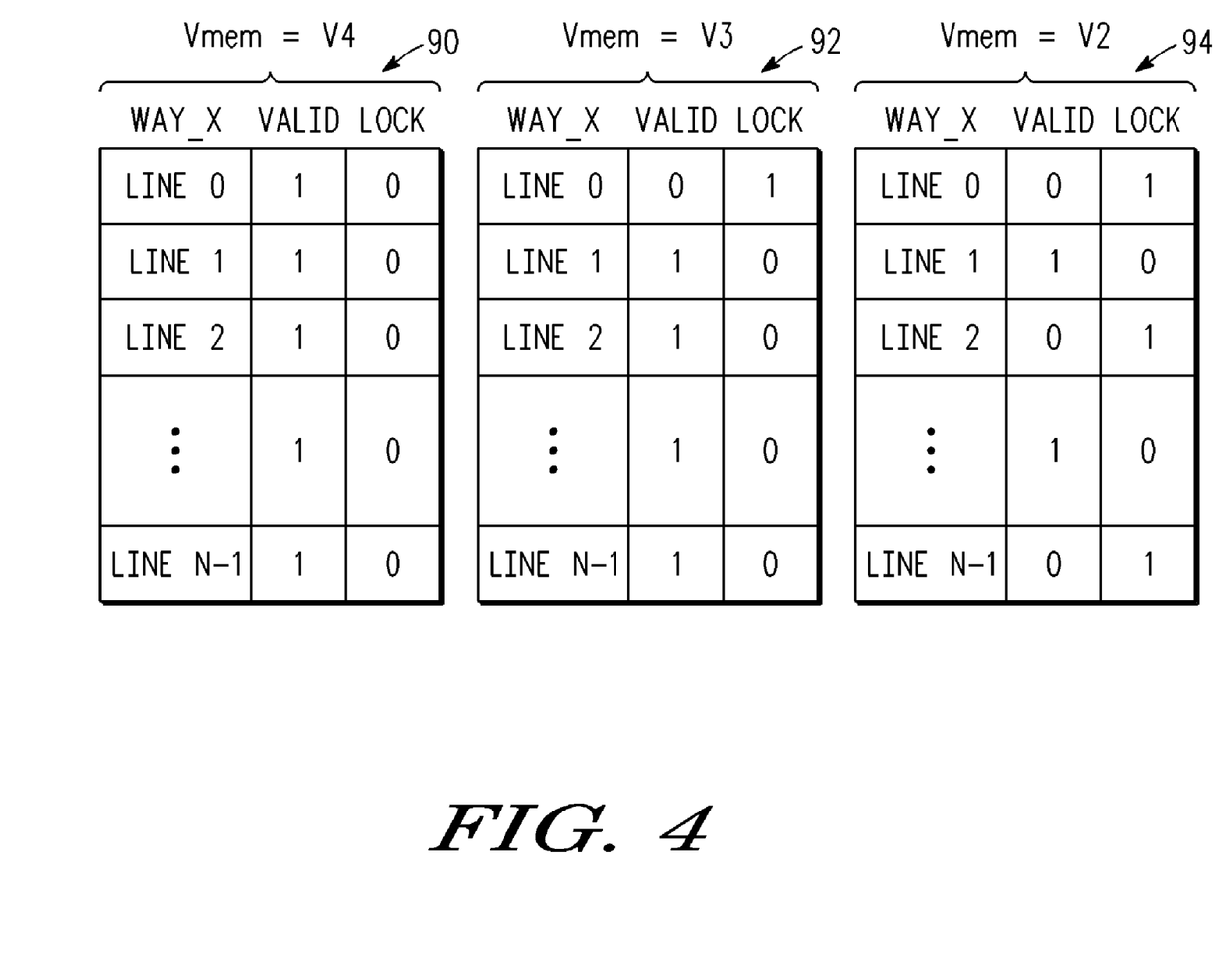
FIG. 4 illustrates, in diagrammatic form, an example of the use of status bits of the cache of FIG. 2, in accordance with one embodiment of the present invention.

FIG. 4 illustrates, in diagrammatic form, an example of the use of status bits of cache circuitry 21, in accordance with one embodiment of the present invention. For example, in one embodiment, the status bits of each cache line may include a valid bit to indicate whether the cache line is valid and a lock bit to indicate whether or not the cache line can be replaced. That is, when a cache line is valid but locked, that cache line cannot be selected for replacement by the allocation policy. In one embodiment, the combination of the valid bit and lock bit for each cache line may be used to disable or re-enable particular lines of cache circuitry 21 based on the value of Vmem.

For example, FIG. 4 illustrates sample tables 90, 92, and 94 for each of Vmem equals V4, V3, and V2, respectively, for a particular way (way_x, which correspond to any one of ways 0-7) of cache circuitry 21. Table 90 indicates, for Vmem=V4 (which, in the example of FIG. 2, is the highest voltage value of V1-V4), which cache lines of way_x are available for use (i.e. which cache lines are considered functional at Vmem=V4). In the illustrated embodiment, table 90 indicates that each of lines 0 to N-1 are available. That is, all the lines are marked as valid but none are locked and thus all can be selected by the allocation policy. However, when Vmem=V3, table 92 indicates that line 0 of way_x is not longer available because it may not be reliably accessed at the reduced voltage of V3. In this case, the valid bit is cleared to 0, but the lock bit is set to 1. In this manner, the combination of a valid bit of 0 and a lock bit of 1 may be used to indicate to allocation circuitry 42 that the allocation policy needs to be updated to mask out this particular line of way_x. Similarly, when Vmem=V2, table 94 indicates that lines 0, 2, and N-1 of way_x are not longer available because they may not be reliably accessed at the further reduced voltage of V2. In this case, the valid bit is cleared to 0 and the lock bit set to 1 for each of lines 0, 2, and N-1 of way_x. Therefore, in one embodiment, another table would be present for Vmem=V1 (not illustrated) which would indicate which lines are to be enabled for V1.

Therefore, note that a set of 4 tables may be created for each way of ways 0 to 7. In one embodiment, the information for these tables may be stored in cache control circuitry 40, such as, for example, in mapping control circuitry 46. For example, in one embodiment, mapping registers 45 may include one or more registers which store, for each voltage V1-V4, and for each way 0-7, which cache lines should be made unavailable (such as by clearing the valid bit and setting the lock bit for those cache lines). Also, in this embodiment, way enabling/disabling circuitry 44 may be replaced by cache line enabling/disabling circuitry and the signal SELECTED WAYS may be replaced by a SELECTED CACHE LINES signal. way enabling/disabling circuitry 44 may be replaced by cache line enabling/disabling circuitry. Note that by increasing the size of the mapping registers, finer granularity (a cache line versus a cache way) of voltage mapped cacheable memory locations may be achieved and increased efficiency of voltage controlled cache size scaling may be achieved (especially at lower supply voltages). For example, when Vmem is set to the value V1, any cache line in any of the cache ways (e.g. ways 0-7) that can be functionally accessed may be enabled instead of enabling only ways 0-1 of cache circuitry 21 (as was described in an example above in reference to FIG. 2). This may increase a total number of cache lines across all the ways for each voltage level V1-V3, except at the highest voltage level V4 where all the ways are available to be enabled. Due to a finer voltage mapping granularity, the voltage level V1 may be scaled down lower than by using a way based mapping granularity.

Note that, in alternate embodiments, a variety of different register or table formats may be used to store the information of tables 90-94, i.e. to store the status bits information of which cache lines should be made unavailable for each cache way for each voltage value. value. For example, in another embodiment, a pair of valid and lock bits may be shared by a plurality of ways, e.g. way 0-7, for a way-interleaved cache array architecture, where data bits mapped onto way 0-7 in a cache line are all coupled to the same physical wordline. In yet another embodiment, a voltage identifier (VID) field may be added to the status array for each cache line entry indicating the lowest voltage at which the cache line can be accessed. For read operations at voltages below the cache line VID, a miss will be forced, even though the desired data may be present, so that the entry is not read since a read operation would corrupt the data. However, for voltages at or above the cache line VID, read accesses are allowed to that entry and the way hit logic for that entry is enabled. Data that was inaccessible but retained at lower voltages can be accessible at higher voltages since the data does not need to be re-fetched. For write operations to a cache line whose VID is below the cache operating voltage, a way miss is forced to prevent a write operation to the cache line since it cannot be reliably written at the lower voltage. The allocation circuitry will select another replacement way that can be reliably written at the current operating voltage based on the VIDs of the ways for that set. Before the cache voltage is transitioned to a lower operating voltage, all the modified cache lines with VIDs above the target operating voltage can be flushed so that data is not lost and cache coherency can be maintained.

In this manner, a flow similar to that of FIG. 3 may be used where, rather than updating the allocation policy to disable or re-enable entire ways of cache circuitry 21, particular cache lines can be disabled or re-enabled in an analogous fashion. For example, mapping control circuitry 46 may provide to way enabling/disabling circuitry 44 the selected cache lines for a particular target Vmem where way enabling/disabling circuitry 44 can update the status information (e.g. the lock and valid bits) of the identified cache lines accordingly and perform any cache coherency operations, as needed.

By now it should be appreciated that there has been provided a cache whose ways can be disabled and re-enabled based on changes in its operating voltage, Vmem. For example, for each value of Vmem, some ways may be functional and considered reliable for data access while other ways may be considered non-functional in which the data access becomes unreliable at that voltage value of Vmem. In this manner, flexibility may be provided for a cache to be able to operate according to different Vmem values without losing access reliability. Furthermore, a cache such as cache 26 may now be capable of operating at lower supply voltages rather than being unusable by scaling the memory size (through, e.g., the enabling and re-enabling of identified ways) in response to different operating voltages (different values of Vmem).

Note that the above embodiments were described in reference to a cache memory, such as cache 26; however, in alternate embodiments, portions of any type of memory may be disabled and then re-enabled based on which portions become functional or non-functional in response to changes in the operating voltage of the memory. In this manner, a memory may now be capable of operating at lower operating voltages rather than being completely unusable by scaling the memory size in response to different operating voltages (different values of Vmem). In one aspect, from a functional yield point of view, a low voltage yield of data processing system 10 may be obtained by effectuating one or more embodiments described above. Otherwise, the functionality of a data processing system could be impeded by caches that failed to operate reliably at lower voltages.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of data processing system 10 are circuitry located on a single integrated circuit or within a same device. Alternatively, data processing system 10 may include any number of separate integrated circuits or separate devices interconnected with each other. For example, memory 28 may be located on a same integrated circuit as processor 30 or on a separate integrated circuit.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

In one embodiment, data processing system 10 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method of using a memory including accessing a memory with a power supply voltage applied to the memory at a first value, reducing the power supply voltage to a second value, identifying a first portion of the memory as being non-functional, wherein the being non-functional is caused by the power supply voltage being at the second value, accessing the memory exclusive of the first portion, increasing the power supply voltage to a third value, identifying a second portion of the first portion that is functional with the power supply being applied at the third value, and accessing the memory including the second portion. Item 2 includes the method of item 1 wherein the first value and the third value are the same. Item 3 includes the method of item 1, wherein the second portion includes all of the first portion. Item 4 includes the method of item 1, wherein the memory is a cache having a plurality of ways, the step of identifying the first portion is further characterized by the first portion comprising a first set of ways of the plurality of ways, and the step of identifying the second portion is further characterized by the second portion comprising a second set of ways. Item 5 includes the method of item 4, wherein the step of identifying the second portion is further characterized by the second portion being the same as the first portion. Item 6 includes the method of item 5, wherein the memory is a static random access memory. Item 7 includes the method of item 5, wherein the step of identifying the first portion comprises retrieving information that correlates non-functional portions of the memory with values of the power supply voltage. Item 8 includes the method of item 7, wherein the step of identifying the first portion occurs prior to the step of reducing the power supply voltage. Item 9 includes the method of item 8 and further includes asserting a request to decrease the power supply voltage prior to the step of identifying the first portion. Item 10 includes the method of item 9 and further includes operating the memory according to an allocation policy, altering the allocation policy responsive to the step of identifying the first portion, and altering the allocation policy responsive to the step of identifying the second portion.

Item 11 includes a method of operating a system with a cache having a plurality of ways including operating the cache with a power supply voltage applied at a first value according to an allocation policy, asserting a request to decrease the power supply voltage to a second value, identifying a first set of ways of the plurality of ways that need to be disabled based on the power supply voltage being at the second value, masking out the first set of ways from the allocation policy, applying the power supply voltage at the second value, operating the cache with the power supply voltage applied at the second value according to the allocation policy with the first set of ways masked out, applying the power supply voltage at a third value greater than the second value, identifying a second set of ways from the first set of ways that can be added based on the power supply being applied at the third value, adding the second set of ways to the allocation policy, and operating the cache with the power supply voltage applied at the third value according to the allocation policy with the second set of ways added. Item 12 includes the method of item 11, wherein the first set of ways and the second set of ways are the same. Item 13 includes the method of item 12, wherein the third value is the same as the first value. Item 14 includes the method of item 13 and further includes performing cache coherency operations on lines of the first set of ways prior to the step of applying the power supply at the second value. Item 15 includes the method of item 14, and further includes deasserting the request to decrease the power supply voltage to a second value prior to the step of operating the cache with the power supply voltage applied at the third value according to the allocation policy with the second set of ways added.

Item 16 includes a system having a cache controller, a cache coupled to the cache controller that has a plurality of ways, operates according to an allocation policy, and is powered by a power supply voltage, and a processor coupled to the cache and the cache controller. The cache controller responds to a request generated by the processor to decrease the power supply voltage applied to the cache by identifying a first set of ways and masking the first set of ways from the allocation policy. The cache receives the reduced power supply voltage, is accessed by the processor exclusive of first set of ways, receives an increased power supply voltage after being accessed by the processor while receiving the reduced power supply voltage, and has a second set of ways from the first set of ways accessible by the processor while the cache is powered by the increased power supply voltage. Item 17 includes the system of item 16, wherein the allocation policy is changed by the cache controller in response to the power supply voltage changing from the decreased power supply voltage to the increased power supply voltage. Item 18 includes the system of item 17, wherein the first set of ways and the second set of ways are the same. Item 19 includes the system of item 18, wherein the first set of ways is identified by the cache controller accessing information that correlates non-functional portions of memory with a magnitude of the power supply voltage. Item 20 includes the system of item 19, wherein the cache controller receives a constant power supply voltage while the cache receives the power supply voltage at the increased power supply voltage and the decreased power supply voltage.

What is claimed is:

1. A method of using a cache having a plurality of ways, comprising:
    accessing the cache with a power supply voltage applied to the cache at a first value;
    reducing the power supply voltage to a second value;
    identifying a first set of ways of the plurality of ways as being non-functional, wherein the being non-functional is caused by the power supply voltage being at the second value, wherein the first set of ways is less than all ways of the cache, and the step of identifying the first set of ways comprises:
        retrieving information that correlates non-functional ways of the cache with values of the power supply voltage;
    accessing the cache exclusive of the first set of ways, wherein the step of accessing the cache exclusive of the first set of ways is performed with the power supply voltage at the second value;
    increasing the power supply voltage to a third value;
    identifying a second set of ways of the first set of ways that is functional with the power supply being applied at the third value; and
    accessing the cache including the second set of ways.

2. The method of claim 1, wherein the first value and the third value are the same.

3. The method of claim 1, wherein the second set of ways includes all of the first set of ways.

4. The method of claim 1, wherein the step of identifying the second set of ways is further characterized by the second set of ways being the same as the first set of ways.

5. The method of claim 1, further comprising:
    performing cache coherency operations on lines of the first set of ways prior to the step of applying the power supply at the second value.

6. The method of claim 1, further comprising:
    operating the cache according to an allocation policy;
    altering the allocation policy responsive to the step of identifying the first set of ways; and
    altering the allocation policy responsive to the step of identifying the second set of ways.

7. The method of claim 4, wherein the cache is a static random access memory.

8. The method of claim 4, wherein the step of identifying the first subset of ways portion occurs prior to the step of reducing the power supply voltage.

9. The method of claim 8, further comprising:
    asserting a request to decrease the power supply voltage prior to the step of identifying the first set of ways.

10. The method of claim 9, further comprising:
    operating the cache according to an allocation policy;
    altering the allocation policy responsive to the step of identifying the first set of ways; and
    altering the allocation policy responsive to the step of identifying the second set of ways.

11. A method of operating a system with a cache having a plurality of ways, comprising:
    operating the cache with a power supply voltage applied at a first value according to an allocation policy;
    asserting a request to decrease the power supply voltage to a second value;
    identifying a first set of ways of the plurality of ways that need to be disabled based on the power supply voltage being at the second value;
    masking out the first set of ways from the allocation policy;
    applying the power supply voltage at the second value;
    operating the cache with the power supply voltage applied at the second value according to the allocation policy with the first set of ways masked out;
    applying the power supply voltage at a third value greater than the second value;
    identifying a second set of ways from the first set of ways that can be added based on the power supply being applied at the third value;
    adding the second set of ways to the allocation policy;
    operating the cache with the power supply voltage applied at the third value according to the allocation policy with the second set of ways added.

12. The method of claim 11, wherein the first set of ways and the second set of ways are the same.

13. The method of claim 12, wherein the third value is the same as the first value.

14. The method of claim 13, further comprising:
    performing cache coherency operations on lines of the first set of ways prior to the step of applying the power supply at the second value.

15. The method of claim 14, further comprising deasserting the request to decrease the power supply voltage to a second value prior to the step of operating the cache with the power supply voltage applied at the third value according to the allocation policy with the second set of ways added.

16. A system, comprising:
    a cache controller;
    a cache coupled to the cache controller that has a plurality of ways, operates according to an allocation policy, and is powered by a power supply voltage; and
    a processor coupled to the cache and the cache controller, wherein:
the cache controller responds to a request generated by the processor to decrease the power supply voltage applied to the cache by identifying a first set of ways and masking the first set of ways from the allocation policy; and
the cache receives the reduced power supply voltage, is accessed by the processor exclusive of first set of ways, receives an increased power supply voltage after being accessed by the processor while receiving the reduced power supply voltage, and has a second set of ways from the first set of ways accessible by the processor while the cache is powered by the increased power supply voltage.

17. The system of claim 16, wherein the allocation policy is changed by the cache controller in response to the power supply voltage changing from the decreased power supply voltage to the increased power supply voltage.

18. The system of claim 17, wherein the first set of ways and the second set of ways are the same.

19. The system of claim 18, wherein the first set of ways is identified by the cache controller accessing information that correlates non-functional portions of memory with a magnitude of the power supply voltage.

20. The system of claim 19, wherein the cache controller receives a constant power supply voltage while the cache receives the power supply voltage at the increased power supply voltage and the decreased power supply voltage.

* * * * *